United States Patent
Hegde et al.

(10) Patent No.: US 12,176,178 B2
(45) Date of Patent: Dec. 24, 2024

(54) SCANNING ION BEAM DEPOSITION AND ETCH

(71) Applicant: Plasma-Therm NES LLC, St. Petersburg, FL (US)

(72) Inventors: Sarpangala Hariharakeshava Hegde, Fremont, CA (US); Vincent Lee, Fremont, CA (US)

(73) Assignee: PLASMA-THERM NES LLC, St. Petersburg, FL (US)

( * ) Notice: Subject to any disclaimer, the term of this patent is extended or adjusted under 35 U.S.C. 154(b) by 363 days.

(21) Appl. No.: 17/686,356

(22) Filed: Mar. 3, 2022

(65) Prior Publication Data

US 2022/0189727 A1 Jun. 16, 2022

Related U.S. Application Data

(60) Continuation-in-part of application No. 17/536,025, filed on Nov. 27, 2021, now Pat. No. 11,646,171, which is a division of application No. 16/398,487, filed on Apr. 30, 2019, now Pat. No. 11,227,741.

(60) Provisional application No. 62/666,324, filed on May 3, 2018.

(51) Int. Cl.
| | |
|---|---|
| *H01J 37/147* | (2006.01) |
| *H01J 37/24* | (2006.01) |
| *H01J 37/32* | (2006.01) |
| *H01L 21/3065* | (2006.01) |

(52) U.S. Cl.
CPC ........ *H01J 37/1474* (2013.01); *H01J 37/243* (2013.01); *H01J 37/32715* (2013.01); *H01L 21/3065* (2013.01); *H01J 2237/20207* (2013.01); *H01J 2237/20214* (2013.01);
(Continued)

(58) Field of Classification Search
CPC ............ H01J 37/1474; H01J 37/243; H01J 37/32715; H01J 2237/20207; H01J 2237/20214; H01J 2237/20228; H01J 2237/3323; H01J 2237/3341
See application file for complete search history.

(56) References Cited

U.S. PATENT DOCUMENTS

| 4,278,493 A | 7/1981 | Petvai |
| 2005/0214477 A1 | 9/2005 | Hanawa et al. |
| (Continued) | | |

FOREIGN PATENT DOCUMENTS

| JP | H08134668 | 5/1996 |
| JP | 2009246009 | 10/2009 |

OTHER PUBLICATIONS

Goglia Peter et al, Advanced Techniques for Enhanced Ion Beam Etch Uniformity, 2018 China Semiconductor Technology International Conference (CSTIC) Mar. 11-12, 2018, IEEE, May 31, 2018, pp. 1-3, XP033351657, DIU: 10.1109/CSTIC.2018.8369232, Abstract, pp. 1-3; Figures 1-3, 5, 7, 8.

*Primary Examiner* — Binh X Tran
(74) *Attorney, Agent, or Firm* — Harvey S. Kauget; Burr & Forman LLP

(57) ABSTRACT

The present disclosure provides a method to adjust asymmetric velocity of a scan in a scanning ion beam deposition or etch process to correct asymmetry of depositing or etching between the inboard side and the outboard side of device structures on a wafer, while maintaining the overall uniformity of the respective deposition or etch across the full wafer.

21 Claims, 12 Drawing Sheets

(52) U.S. Cl.
    CPC ............ *H01J 2237/20228* (2013.01); *H01J 2237/3323* (2013.01); *H01J 2237/3341* (2013.01)

(56) References Cited

U.S. PATENT DOCUMENTS

| | | | |
|---|---|---|---|
| 2009/0071818 A1* | 3/2009 | Fukumiya | C23C 14/10 204/298.04 |
| 2009/0084757 A1 | 4/2009 | Erokhin et al. | |
| 2014/0227460 A1* | 8/2014 | Hegde | H01J 37/3476 427/595 |
| 2015/0090583 A1* | 4/2015 | Kodaira | H01J 37/32357 204/192.34 |
| 2016/0155602 A1 | 6/2016 | Kamino et al. | |
| 2017/0069526 A1 | 3/2017 | Park et al. | |
| 2018/0068828 A1* | 3/2018 | Halling | H01J 37/3171 |
| 2018/0154443 A1* | 6/2018 | Milshtein | B22F 12/41 |
| 2018/0197715 A1* | 7/2018 | Gwinn | H01J 37/147 |
| 2018/0250775 A1* | 9/2018 | Spink | B23K 26/10 |
| 2020/0335331 A1* | 10/2020 | Xiao | C23C 14/225 |

* cited by examiner

Figure 1
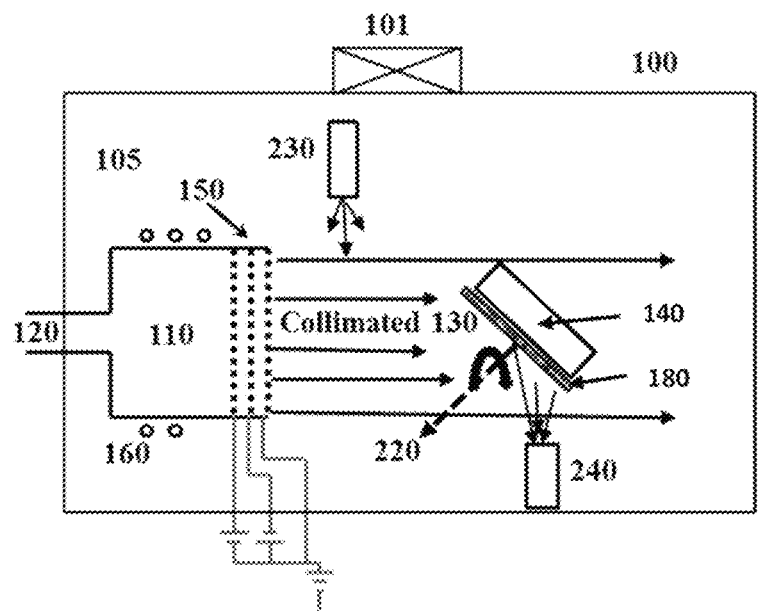
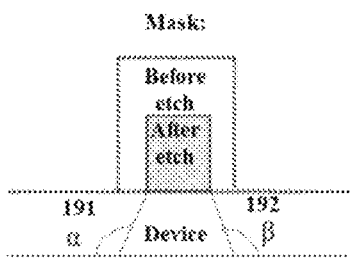
Figure 2a
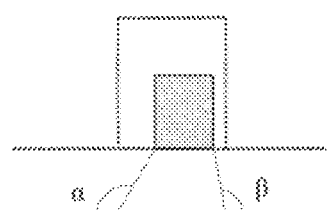
Figure 2b
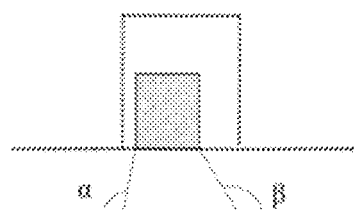
Figure 2c wafer top view wafer x-sect view Practical Beam Ideal Beam

SCANNING ION BEAM DEPOSITION AND ETCH

CROSS-REFERENCE TO RELATED APPLICATION

This application is a continuation in part of U.S. patent application Ser. No. 17/536,025 entitled: Scanning Ion Beam Etch filed on Nov. 27, 2021 which is a divisional of U.S. patent application Ser. No. 16/398,487 entitled: Scanning Ion Beam Etch filed on Apr. 30, 2019, which claims the benefit of U.S. patent application Ser. No. 62/666,324, filed on May 3, 2018, the contents of which are incorporated herein by reference in their entirety.

STATEMENT REGARDING FEDERALLY SPONSORED RESEARCH OR DEVELOPMENT n/a

TECHNICAL FIELD

The present disclosure relates to the field of charged particle sources including plasma sources for direct etching and deposition, broad-beam ion sources for ion beam deposition and etching, and electron sources for surface modification.

BACKGROUND

FIG. 1 illustrates an ion beam etch (IBE) system. In an IBE process, wafer 180 is placed in front of an ion source 105. At least one surface of the wafer 180 can be exposed to a beam 130. Ion source 105 can be comprised of a plasma chamber 110, and an ion extraction grid system 150. Ion extraction grid system 150 is comprised of a plurality of conducting plates that have multiple holes therein aligned from plate to plate. Grid system 150 extracts and helps collimate ion beamlets coming out of each of the holes of the plates, and forms a substantially collimated ion beam 130. Plasma in the plasma source may be generated by methods known in the art including direct current (DC) and radio frequency (RF) inductively coupled plasma (ICP) coils 160. The energy of the ions extracted from the ion source 105 is defined by the voltages applied to the grid system 150.

An electron source 230, may be placed between the ion extraction grid system 150 and a wafer stage to prevent charge damage from the impinging ions on the wafer. Wafer 180, is placed on wafer stage 140. The stage 140 can rotate the wafer about a central axis 220. The stage 140 can tilt the wafer 180 with respect to the ion beam 130 for at least a portion of the etching process. Ions from the beam 130 can be directed at any angle with respect to the wafer surface by tilting the wafer 180. Any solid material can be etched with an IBE process. Provisions may be made on the wafer stage 140 to cool the wafer 180 during the etching process to prevent thermal damage to the devices on the wafer 180. Wafer 180 may also be heated to a specific temperature to enhance the ion beam etching process.

A typical wafer 180 can include many devices and may be covered with photoresist masks or other type of masks. The devices can be processed with ion beam exposure to etch the desired shape of the devices on the wafer 180. The desired shape of the devices can be achieved by adjusting process parameters including, for example: wafer tilt angle during etch, duration of etch, beam energy, beam current, Photoresist mask sidewall angles, wafer temperature, etc. An end point detector 240 may be placed in line of sight of the wafer 180 when the devices are made of multilayer materials and precise end pointing of the etch at a predetermined layer is often desired.

The devices on wafer 180 being etched are expected to show similar shapes (e.g., sidewall profiles, etc.) However, devices can show different shapes depending on the location of the devices on the wafer 180. One example of a specific type of shape difference is called inboard and outboard asymmetry. FIGS. 2a-2c show a schematic representation of the asymmetry of the inboard (IB) side 191 of a device and the outboard (OB) side 192 of a device after ion beam etching. The asymmetry may be quantified as the sidewall angle differences on one side $\alpha$ versus the opposite side $\beta$. FIG. 2a shows symmetric etching. FIG. 2b and FIG. 2c show asymmetric etching.

The asymmetry of the IB side 191, and the OB side 192 of devices in ion beam etching often has a specific relationship to the tilting of the wafer 180. This relationship is shown in FIGS. 3a-3b. FIG. 3a is a top view of a wafer 180 being etched. The tilt axis runs along the diagonal of the wafer as shown with respect to the wafer top view. In FIG. 3a, wafer 180 is being etched by an ion beam impinging on it from a direction perpendicular to the plane of the paper. FIG. 3b is a cross section view of FIG. 3a along the wafer diagonal perpendicular to the tilt axis. In FIG. 3b, the wafer cross-section, direction of tilt axis runs along the middle of the wafer, and perpendicular to the plane of the paper. Asymmetry between the IB side 191 of the device and the OB side 192 of the device can be seen on the devices located towards the top and bottom of the wafer 180. The asymmetry becomes more pronounced the further away the device is from the tilt axis, and as the tilt angle is increased, e.g., the wafer 180 is tilted further from the normal angle of incidence of the incident beam.

In a perfect ion source, and grid system, all beamlets would be perfectly collimated, with no divergence of the ions from the intended direction. In such a system, all features etched on the wafer 180 would be perfectly symmetrical. Practical ion beam etch systems have non-zero beam divergence.

In practice, ion sources generate an ion beam that is a collection of beamlets with a finite non-zero beam divergence, as illustrated in FIG. 4. Beamlet divergence 131 is shown in this figure. A consequence of the beamlet divergence is that as the wafer is tilted away from normal beam incidence, there will be more intense etching on the side of the wafer 180 nearer to the ion source, and less intense etching on the side of the wafer 180 farther from the ion source. By rotating the wafer 180 about an axis 220, the etch depths can be made more uniform in the areas of the wafer 180 that are feature free. Devices on the wafers 180 however are typically made of features in 3-dimensions and not flat surfaces. On 3-dimensional features on the wafer 180, the effect of the tilting of the wafer 180 away from normal beam incidence, in conjunction with beam divergence, is that the inboard side 191 of the devices on the wafer 180 will experience a different amount of beam exposure than the outboard side 192 of the devices. This inboard and outboard asymmetry becomes more pronounced as the location of the devices is farther away from the tilt axis of the wafer 180, and as the tilt angle is increased away from normal beam incidence.

Translating (e.g., scanning) the wafer 180 across the beam can address asymmetry between the inboard side 191 of the device and the outboard side 192 of the device. In FIG. 5, the region marked by double ended arrow 550 is the region where ion beam exposure of the wafer occurs. A single instance of translation of the wafer, translation starting at any point where all regions of the wafer is outside of the region shown by 550, translation path taking the wafer through the region represented by 550, is considered one scan. In FIG. 7, region 550, where ion beam exposure occurs is defined through the introduction of physical beam blocks 171, and 172.

In some embodiments, the path of the wafer 180 during translation is defined as the scan path. The scan path can be within a plane that is parallel (or nearly parallel) to the plane of the tilted wafer surface for at least one scan. The scan path of wafer translation can be linear for at least one scan. The path of wafer translation can be non-linear (e.g., curved) for at least one scan. The scan path can be parallel to the tilted wafer 180 for at least one scan. The wafer tilt can be constant during the scan path for at least one scan. The wafer tilt can vary along the path of the scan for at least one scan. The scan path can be parallel to the wafer 180 during at least one point in the scan for at least one scan. The scan path can be parallel to the wafer 180 at all points during the scan for at least one scan. The scan path can be in a different plane than the wafer 180 for at least one scan. The scan path can be within a plane that is parallel (or nearly parallel) to the plane of the tilted wafer surface for all scans. The scan path of wafer translation can be linear for all scans. The path of wafer translation can be non-linear (e.g., curved) for all scans. The scan path can be parallel to the tilted wafer 180 for all scans. The wafer tilt can be constant during the scan path for all scans. The wafer tilt can vary along the path of the scan for all scans. The scan path can be parallel to the wafer 180 during at least one point in the scan for all scans. The scan path can be parallel to the wafer 180 at all points during the scan for all scans. The scan path can be in a different plane than the wafer 180 for all scans.

SUMMARY OF THE INVENTION

In accordance with an embodiment, the present disclosure relates to using asymmetric scanning velocity in an ion beam etch process to correct asymmetry of etching between the inboard side and the outboard side of device structures on a wafer while maintaining the overall uniformity of etch across the full wafer.

In accordance with another embodiment, the present disclosure relates to using asymmetric scanning velocity in an ion beam etch process to generate exaggerated asymmetry of etching between inboard and outboard sides of devices on a wafer, while maintaining the overall uniformity of etch across the full wafer.

In accordance with another embodiment, the present disclosure relates to using symmetric velocity scanning to enable control of inboard and outboard asymmetry even when the ion beam system is configured with a small ion source, and small grids. Without asymmetric velocity scanning, the ion source and grids will need to be of a lateral dimension larger than the sum of the wafer diameter, two times the beamlet divergence projected on the plane of the scan, and the ion beam density will need to be highly uniform across the lateral dimension.

In accordance with another embodiment, the present disclosure relates to using asymmetric velocity scans combined with symmetric velocity scans to address the inboard and outboard asymmetry and wafer etch uniformity, where the number of scans needed to finish the etch process may be a single scan or multiple scans.

In accordance with another embodiment, the present disclosure relates to a process whereby scan motion may be a straight linear motion of the wafer center across the ion beam or may include slight deviations from straight lines such as curved paths of motion of the wafer center across the ion beam.

In accordance with another embodiment, the present disclosure relates to an alternative to asymmetric velocity scan motion of the wafer where the ion beam current or the ion beam voltage is modulated as the wafer moves across the ion beam. The wafer may be exposed to either larger beam current or higher beam voltage when the wafer center is scanning on the far side of the scan beyond the mid-plane of the ion source.

In accordance with another embodiment, the present disclosure relates to an alternative to an asymmetric velocity profile scan by modulating the path of the scan, so that the wafer spends more time exposed to the ion beam on the far side of the scan after the wafer has passed the mid-plane of the ion source.

In accordance with another embodiment, the present disclosure relates to an alternative to the asymmetric velocity scan of the wafer across an ion beam by placing beam blocks in an asymmetric fashion with respect to the mid-plane of the ion source and grids, so that the wafer spends more time exposed to the ion beam on the far side of the scan even with the symmetrical velocity profile of the scan.

According to one aspect of an embodiment of the present disclosure, a method of correcting asymmetry during a wafer etching process is provided, where the method includes producing a plasma from a plasma source, the plasma source comprising a plasma chamber and an ion extraction grid system, the ion extraction grid system configured to produce an ion beam from the plasma, the ion beam having a central axis, supporting a wafer on a stage, scanning the wafer relative to the ion beam along a scan path, and modifying applied beam flux as a function of a position of the wafer.

According to another aspect of an embodiment of the present disclosure, a method of correcting asymmetry during a wafer etching process is provided, where the method includes producing a plasma from a plasma source, the plasma source comprising a plasma chamber and an ion extraction grid system, the ion extraction grid system configured to produce an ion beam from the plasma, the ion beam having a central axis, supporting a wafer on a stage including at least one of rotating the stage about the central axis and tilting the stage with respect to the ion beam during at least a portion of the etching process, scanning the wafer relative to the ion beam along a scan path in accordance with a scan velocity function, and modifying applied beam flux as a function of a position of the wafer by varying the scan velocity function as the wafer travels along the scan path.

According to another aspect of an embodiment of the present disclosure, a method of correcting asymmetry during a wafer etching process is provided, where the method includes producing a plasma from a plasma source, the plasma source comprising a plasma chamber and an ion extraction grid system, the ion extraction grid system configured to produce an ion beam from the plasma, the ion beam having a central axis, supporting a wafer on a stage, scanning the wafer relative to the ion beam along a scan path, the scan path comprising a scan out path from the first end of the ion beam to the second end of the ion beam according to a scan out velocity function and a scan back path from the second end of the ion beam to the first end of the ion beam according to a scan back velocity function, wherein one of the scan out velocity function and the scan back velocity function varies as a function of time, and modifying applied beam flux as a function of a position of the wafer.

According to another aspect of an embodiment of the present disclosure, a method of correcting asymmetry during a wafer deposition process is provided, where the method includes producing a plasma from a plasma source, the plasma source comprising a plasma chamber and an ion extraction grid system, the ion extraction grid system configured to produce an ion beam from the plasma, the ion beam having a central axis, supporting a wafer on a stage, scanning the wafer relative to the ion beam along a scan path, and modifying applied beam flux as a function of a position of the wafer.

According to another aspect of an embodiment of the present disclosure, in an ion-beam sputtering system having a vacuum chamber, a wafer on a stage, a target material, an ion-beam source, a method of depositing a uniform layer of sputtered material onto said wafer in said ion-beam sputtering system, comprising the steps of: generating ions from the ion beam source; directing the generated ions at the target material whereby a portion of the target material is sputtered toward said wafer as part of a deposition plume; exposing the wafer to the deposition plume within a deposition zone; and scanning the wafer across the deposition zone along a scan path relative to the deposition plume, wherein a scan velocity of the wafer is varied as the wafer travels along the scan path, wherein the scan velocity decreases as an area of the wafer exposed to the deposition plume decreases.

According to another aspect of an embodiment of the present disclosure, in an ion-beam sputtering system having a vacuum chamber, a wafer on a stage, a target material, an ion-beam source, a method of depositing a uniform layer of material on said wafer in said ion-beam sputtering system, comprising the steps of: generating ions from the ion beam source; directing the generated ions at the target material whereby a portion of the target material is sputtered toward said wafer as part of a deposition plume; exposing the wafer to the deposition plume within a deposition zone; and scanning the wafer across the deposition zone along a scan path relative to the deposition plume in accordance with a scan velocity function, wherein a scan velocity of the wafer is varied as the wafer travels along the scan path, wherein the scan velocity decreases as an area of the wafer exposed to the deposition plume decreases.

Additional features and advantages of the disclosure will be set forth in the description which follows, and in part will be obvious from the description, or can be learned by practice of the herein disclosed principles. The features and advantages of the disclosure can be realized and obtained by means of the instruments and combinations particularly pointed out in the appended claims. These and other features of the disclosure will become more fully apparent from the following description and appended claims, or can be learned by the practice of the principles set forth herein.

BRIEF DESCRIPTION OF THE DRAWINGS

In order to describe the manner in which the above-recited and other advantages and features of the disclosure can be obtained, a more particular description of the principles briefly described above will be rendered by reference to specific embodiments thereof which are illustrated in the appended drawings. Understanding that these drawings depict only exemplary embodiments of the disclosure and are not therefore to be considered to be limiting of its scope, the principles herein are described and explained with additional specificity and detail through the use of the accompanying drawings in which:

FIG. 1 illustrates an ion beam etch system;

FIG. 2a illustrates symmetric etching;

FIG. 2b illustrates asymmetric etching;

FIG. 2c illustrates asymmetric etching;

Similar reference characters refer to similar parts throughout the several views of the drawings.

DETAILED DESCRIPTION

Figure 3A:
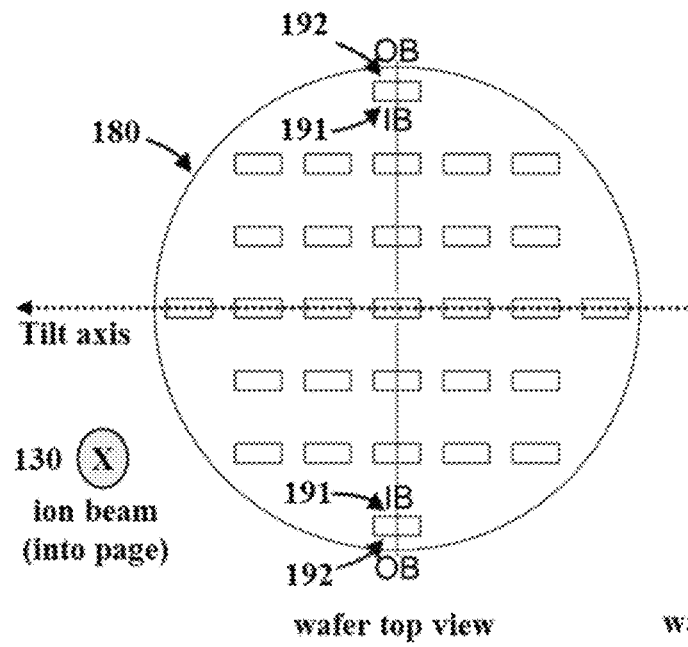
FIG. 3a is a top view of a wafer 180 being etched.
Figure 3B:
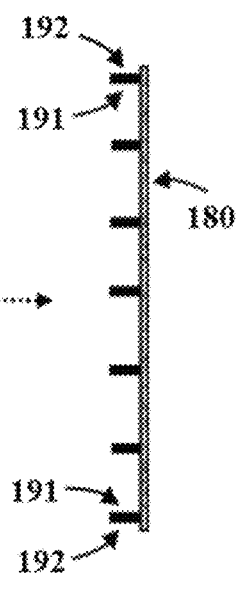
FIG. 3b is a cross section view of FIG. 3a along the wafer diagonal perpendicular to the tilt axis.
Figure 4:
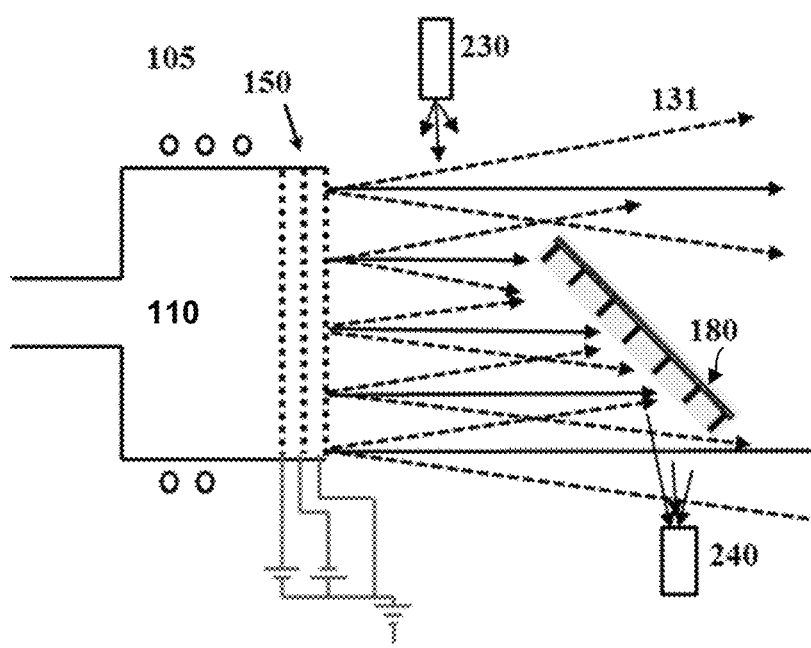
FIG. 4 illustrates ion beam divergence.
Figure 5:
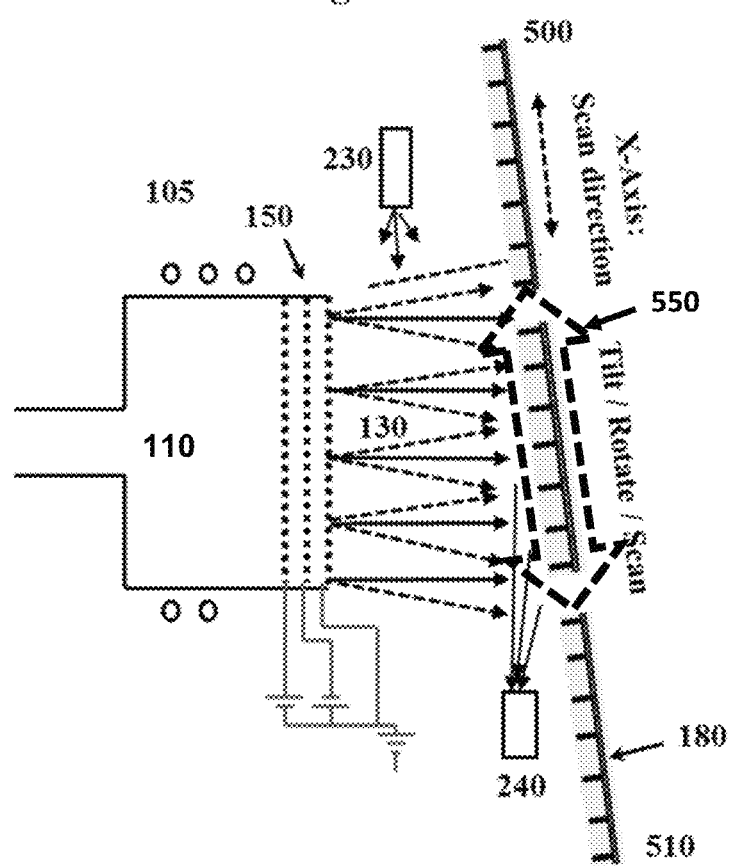
FIG. 5 illustrates an improved scanning ion beam etch system according to an embodiment of the present disclosure.

FIG. 5 shows an illustration of an improved scanning ion beam etch (IBE) system of the present disclosure. Wafer 180 can be tilted off normal incidence with respect to the ion beam, and scanned across the beam starting from outside the beam on one end to the outside of the beam on the opposite end.

In some embodiments, in order to compensate for a non-uniform beam flux, the wafer scan velocity can be varied during a wafer scan. As shown in FIG. 5, the wafer 180 is typically scanned back and forth in and/or through the beam 130. A typical wafer scan can start with the wafer 180 in position 500. The wafer 180 is scanned (e.g., translated) through the beam to position 510. The wafer 180 can then be scanned (e.g., translated) back through the beam from position 510 to position 500. The wafer 180 can be stopped (e.g., zero velocity) between scans (at either or both positions 500 and 510). The path from position 500 to position 510 and back again to position 500 can be a continuous path. The path the wafer 180 follows scanning from position 500 to position 510 can be the same as the path the wafer 180 follows scanning from position 510 to position 500. The path the wafer 180 follows scanning from position 510 to 500 can be different from the path the wafer 180 follows scanning from position 500 to position 510.

The wafer 180 in position 500 and/or position 510 can be at least partially exposed to the beam. The wafer 180 in position 500 and/or position 510 can be completely exposed to the beam. The wafer 180 in position 500 and/or position 510 can be at least partially outside (e.g., not exposed to) the beam. The wafer 180 in position 500 and/or position 510 can be completely outside (e.g., not exposed to) the beam. The position of 500 and/or 510 can be invariant between at least two scans. The position 500 and/or 510 can be invariant for more than two scans. The position 500 and/or 510 can be invariant for all scans. The position of 500 and/or 510 can be changed between at least two scans. The position 500 and/or position 510 can be changed between more than two scans. The position 500 and/or position 510 can be changed between every scan. The length of the wafer scan (e.g., the distance between point 500 and 510) can be constant for at least 2 scans. The length of the wafer scan be constant for all scans. The length of the wafer scan can be different between at least 2 scans. The length of the wafer scan can be different in more than 2 scans. The length of the wafer scan can be different for all wafer scans.

In some embodiments, at least a portion of the wafer 180 can start the scan outside the ion beam. All of the wafer 180 can start the scan outside the ion beam. A portion of the wafer 180 can be exposed to the beam during a scan. All of the wafer 180 can be exposed to the beam during the scan. A portion of the wafer 180 can be outside the beam (e.g., not exposed to the beam) at the end of a scan. All of the wafer 180 can be outside of the beam (e.g., not exposed to the beam) at the end of a scan. In one embodiment, the wafer 180 is not exposed to the beam at the start of a scan, a portion of the wafer 180 is exposed to the beam during the scan, and the wafer 180 is not exposed to the beam at the end of the scan. The wafer 180 can be scanned back and forth at a desired tilt angle with respect to the ion beam. The wafer 180 can be rotated about an axis 220 as it is scanned across the beam. The rotation speed can be constant during the scan. The rotation speed can vary during the scan. The process of scanning at fixed scan velocity can repeated until the desired etch depth is achieved. The scan path can be centered in the beam (e.g., the midpoint of the scan approximately coincides with the center of the beam). The scan path can be offset in the ion beam (e.g., the midpoint of the scan does not coincide with the center of the beam).

This scanning method addresses the inboard and outboard asymmetry arising from the tilt of the wafer 180 and the divergence of the beamlets that cause the near side of the wafer 180 to be etched at a higher rate than the far side of the wafer 180 in a conventional ion beam etch (IBE) machine.

Figure 6:
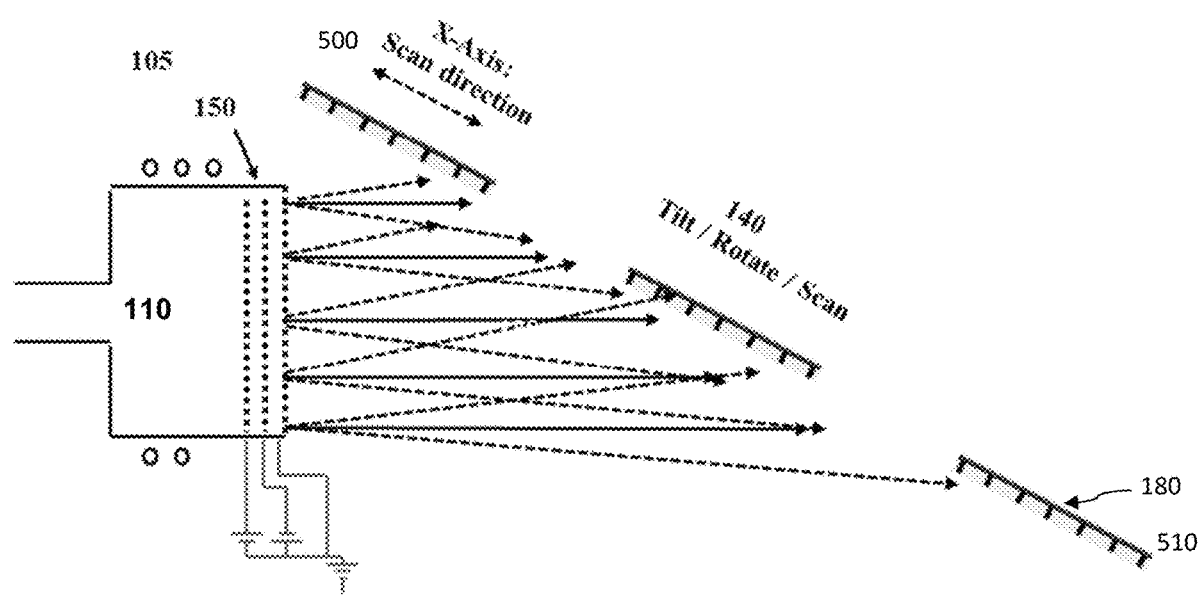
FIG. 6 illustrates an improved scanning ion beam etch system according to an embodiment of the present disclosure.

Many ion beam operations, such as, ion beam smoothing, sidewall etching, and sidewall cleaning, require a large tilt angle with respect to the ion beam. The wafer 180 can be tilted greater than approximately 10 degrees off normal incidence of the ion beam. The wafer 180 can be tilted greater than 30 degrees off normal incidence of the ion beam. Scanning at large tilt angles as shown in FIG. 6, can result in the mid-point of the scan moving further away from the ion source, and the scan length increasing in order to be able to scan the wafer 180 across the ion beam. The increased scan length and the larger distance between the wafer 180 and the source can be difficult to accommodate in a High Vacuum/Ultra High Vacuum Chamber.

Figure 7:
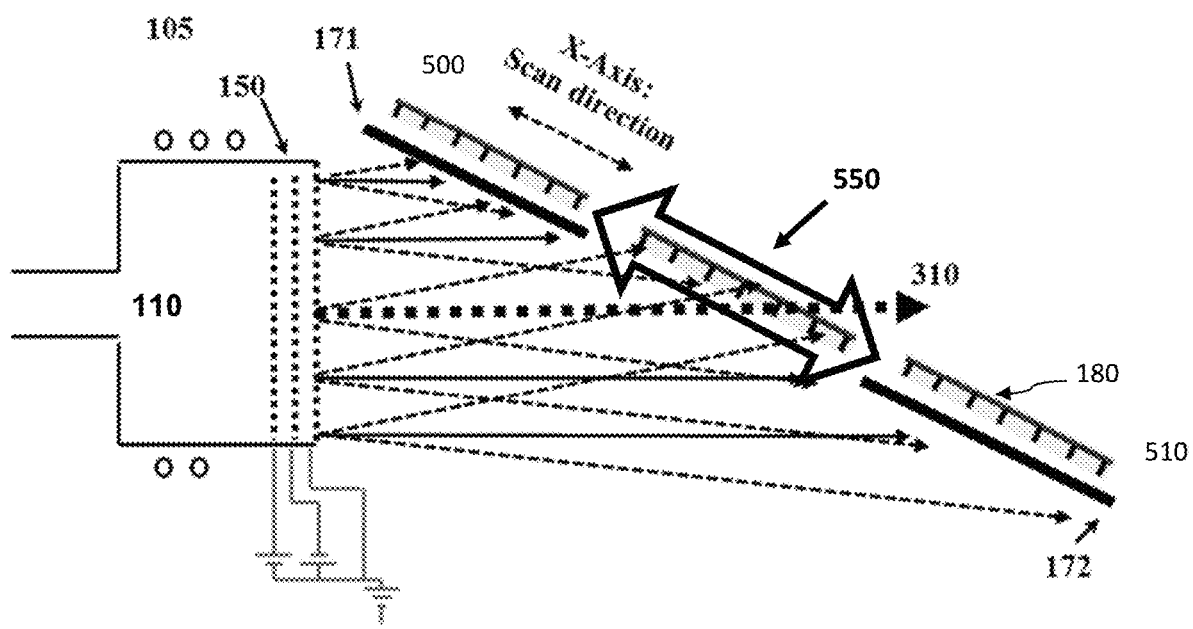
FIG. 7 illustrates an improved scanning ion beam etch system according to an embodiment of the present disclosure.

The required scan length can be decreased by inserting physical blocks, 171 and 172, towards the ends of the scan, as shown in FIG. 7. The blocks 171 and 172 form an aperture that narrows the beam 130, thus creating a portion or "slit" of the ion beam through which the wafer 180 is scanned. The blocks 171 and 172 may be inserted symmetrically with respect to the mid-plane 310 of the ion source 105 and ion extraction grid system 150 as shown in FIG. 7. The blocks 171 and 172 can be inserted asymmetrically with respect to the mid-plane 310. The slit width can be made adjustable by adjusting the positions of the upper block 171, or the lower block 172, or both. However, in cases where scanning the wafer 180 across the slit at large tilt angles is required, the distance from the ion extraction grid system 150 to the wafer 180 at its scan midpoint can be much larger than in conventional ion beam etch (IBE) systems.

In practical IBE systems, the beam density of beam 130 can be spatially non-uniform. This non-uniformity can be due to beamlet divergence. This effect often increases as the source-to-wafer distance increases and can be amplified by a large distance between the wafer scan's mid-point. Scanning the wafer 180 through the beam 130 at constant scan velocity can result in an etch that is highly non-uniform, with the wafer center etching much faster than the edge of the wafer. Deploying a variable scan velocity, as illustrated in the schematic in FIG. 8, can dramatically improve the etch uniformity over the entire wafer 180. Slowing down the velocity of the scan when the wafer 180 is away from the midpoint of the scan can enhance the etching at the points of the wafer 180 away from its center.

In some embodiments, the wafer velocity can be changed during the wafer scan. The wafer scan velocity can be continuously changing during a scan. The wafer scan velocity can be constant during some portion of a scan. The wafer velocity profile can be identical for at least 2 scans. The wafer scan velocity profile can be identical for all scans. The wafer scan velocity can change between at least two scans. The wafer scan velocity profile can change for each scan. The wafer scan velocity can be zero during at least one point during the scan. The wafer velocity profile can be symmetric (see FIG. 8 for example). The scan velocity profile can be monotonic. The scan velocity profile can be discontinuous.

Figure 8:
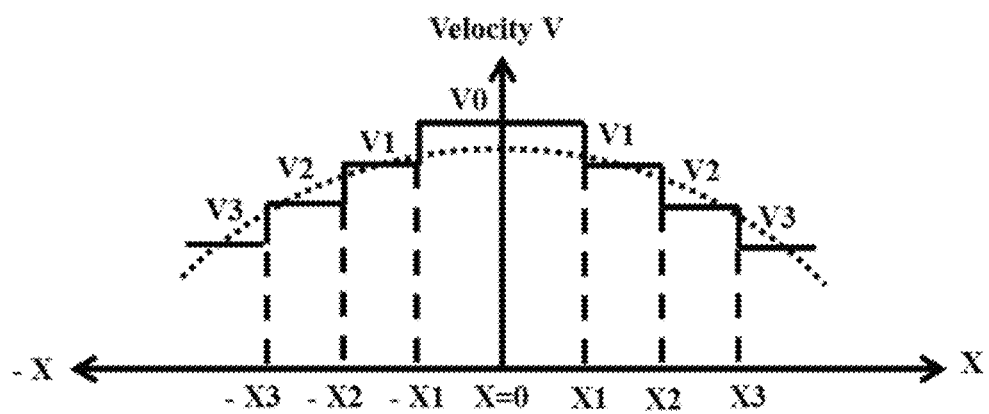
FIG. 8 illustrates variable scan velocity according to an embodiment of the present disclosure.
Figure 9:
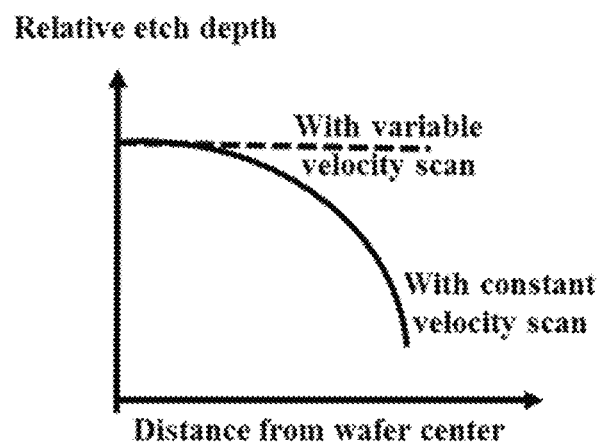
FIG. 9 illustrates relative etch from the wafer center with constant scan velocity and variable scan velocity according to an embodiment of the present disclosure.

Examples of symmetric variable velocity to achieve highly uniform etching over the full wafer 180 are shown in FIG. 8. The midpoint of the scan is represented by X=0. The direction of the scan is along the x-axis. The negative x-axis positions are closer to the ion source 105 than the positive x-axis positions. Variable velocity, which is symmetric about the mid-point of the scan, is shown in the example in FIG. 8. Symmetric variable velocity of the scan can be used to obtain uniform etching across the wafer 180. The symmetric variable velocity profile can be a step function, or a smooth function, as shown in the example in FIG. 8. Symmetric variable velocity as shown in the example here is used to obtain uniform etching across the full wafer 180, as shown in FIG. 9.

Figure 10A:
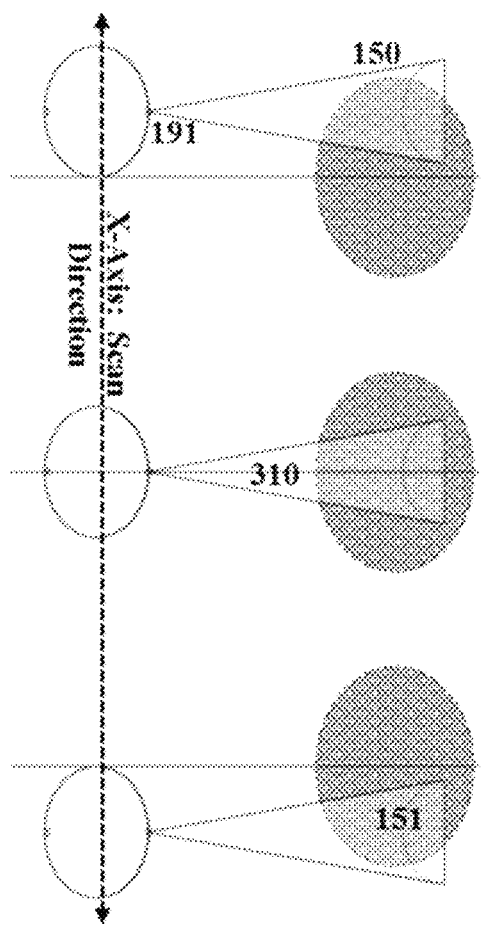
FIG. 10a illustrates beamlet divergence and effect of divergence on the inboard side of the wafer versus the outboard side of wafer as the wafer is scanned across beam according to an embodiment of the present disclosure.
Figure 10B:
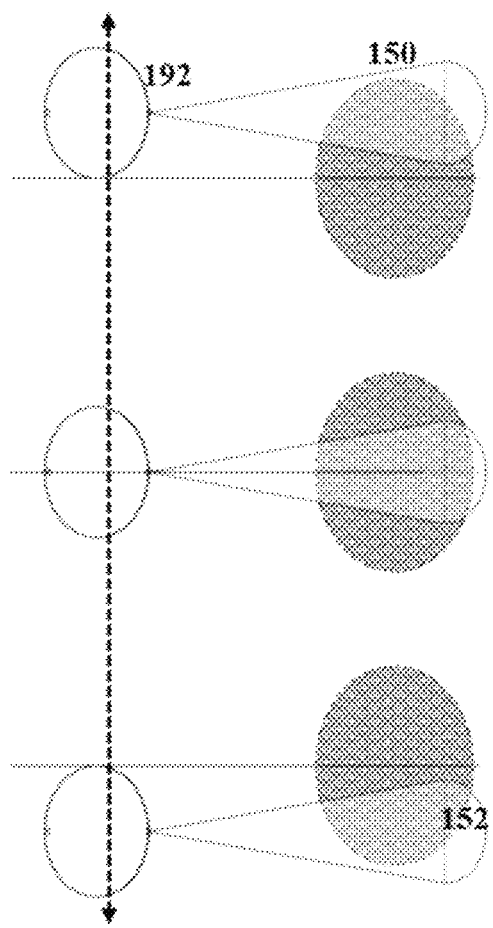
FIG. 10b illustrates beamlet divergence and effect of divergence on the inboard side of the wafer versus the outboard side of wafer as the wafer is scanned across beam according to an embodiment of the present disclosure.

Scanning the wafer 180 across the beam 130 does not address a second cause of inboard and outboard asymmetry of devices. This second cause of asymmetry is caused by the large distance needed to enable the scanning of a tilted wafer 180 across the beam 130, the finite size of the ion source 105 and ion extraction grid system 150, and the beamlet divergence. This effect is illustrated in FIGS. 10a-10b. At large distances, the finite lateral size of the ion source 105, and the beamlet divergences cause the inboard side 191 of the devices to be exposed to larger amount of ions compared to the outboard side of the device. This asymmetry is present at all tilt angles. This is illustrated in FIGS. 10a-10b. A rotating wafer 180, as it is being scanned across the beam 130, causes the outboard side 192 of the device, at the outer edges of the wafer 180, to etch much less than the inboard side 191 of the device as seen in FIGS. 10a-10b. Solid angles projected from the inboard side 191 of the device and the outboard side 192 of the device, to the plane of the ion extraction grid system 150, represent the amount of beam exposure on the inboard side 191, and outboard side 192 respectively, as the wafer 180 is scanned across the beam 130. The imbalance of the beam exposure of the inboard side 191 and outboard side 192 of the devices can be clearly seen in FIG. 10a and FIG. 10b.

Figure 11A:
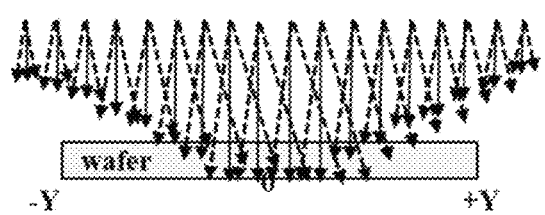
FIG. 11a illustrates a beam that has a higher flux at the center of the beam.
Figure 11A:
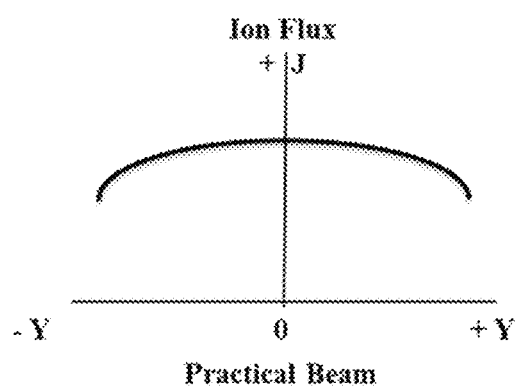
Figure 11B:
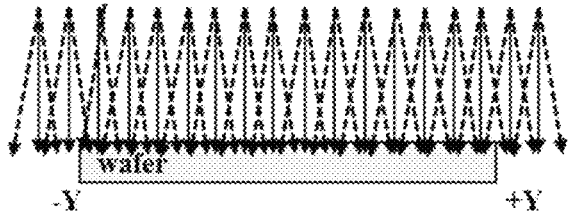
FIG. 11b illustrates a uniform beam where the flux is independent of position in the beam.
Figure 11B:
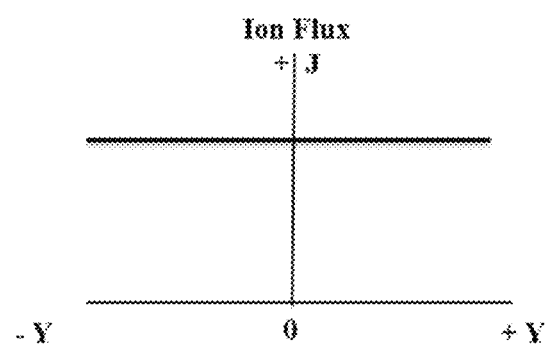

The inboard and outboard etch asymmetry associated with the finite dimension of the ion source 105 and beamlet divergence can be addressed by making the ion source 105 and grids of ion extraction grid system 150 significantly larger in the Y-axis direction, as shown in FIGS. 11a-11b. FIG. 11a shows a beam 130 that has a higher flux at the center of the beam 130. It is possible to have a beam 130 that has a higher flux at the edge of the beam 130 than at the center of the beam 130 (not shown). FIG. 11b shows a uniform beam 130 where the flux is independent of the position in the beam 130. The Y-axis direction is the direction of a scan. Increasing the lateral dimension of the ion source 105 and grids of the ion extraction grid system 150 to be at least equal to the sum of wafer diameter and twice the beamlet divergence and making the ion flux uniform across the lateral dimension, as shown in FIG. 11b, can allow both the inboard side 191 and outboard side 192 of the devices to be exposed to the same amount of ion beam exposure, and eliminate the asymmetry between the inboard side 191 and outboard side 192 of the devices.

The non-ideal ion beam shown in FIG. 11a shows an example of when the flux of the ion beam 130 is higher in the center of the beam 130 compared to an edge of the beam 130. It is possible to have an ion beam 130 where the flux of the ion beam 130 is higher at an edge of the beam 130 compared to the center of the beam 130 (e.g., through magnetic confinement of the beam, a non-uniform grid system, etc.). In this case, it may be desirable to increase the dose in the center of the wafer 180 compared to the edge of the wafer 180 during a scan. The scan velocity at an end of a scan can be greater than the scan velocity in the center of the scan (e.g., the scan velocity for at least one point towards the end of the scan is higher than a point toward the center of the scan).

Establishing and sustaining uniform plasma distribution across a large ion source 105 can be practically difficult. Large variations in plasma density across the lateral dimensions of the plasma source can be difficult to address. Large lateral dimension of grids can cause failures arising from mechanical instabilities related to thermal expansion and contraction cycles of ion source operation. Due to extraordinary challenges associated with larger dimensions of ion sources and large sized grids, it is desirable to address the asymmetry problem with a smaller ion source, and smaller grids.

Figure 12:
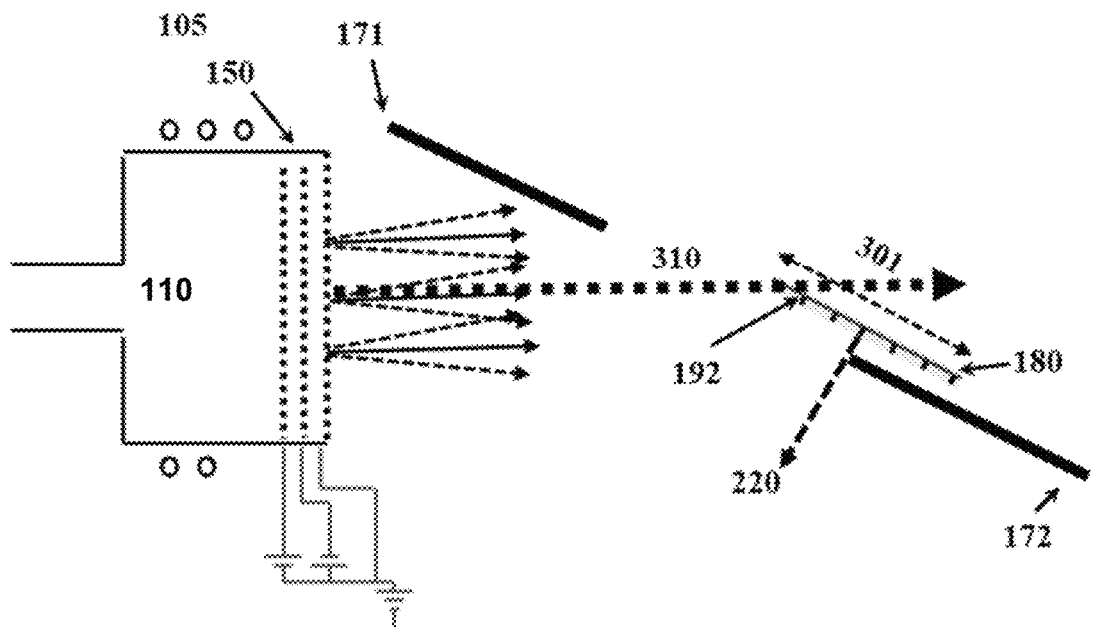
FIG. 12 illustrates the mid-plane of the source and far side of scan where preferential etching of the outboard side of devices occurs.

Referring to FIG. 12, slowing down the scan velocity when the wafer center is on the far side of the scan 301 (e.g., wafer scan positions farther from the ion beam source 105) can also improve uniformity. As shown in FIG. 12, the scan velocity can be reduced for at least a portion of points below the mid-plane 310 of the ion source 105 and ion extraction grid system 150. The reduced scan speed enhances the etching on the outboard side 192 of the devices. By slowing down the scan speed when the wafer center is on the far side of the scan, inboard and outboard asymmetry, which can be present in a symmetric velocity scan, can be improved.

Figure 13:
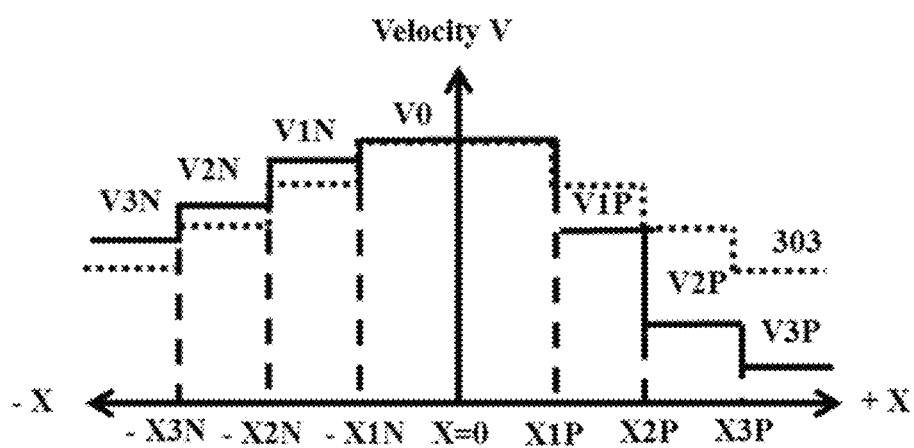
FIG. 13 illustrates one type of asymmetric velocity profile (solid lines) that preferentially etches the outboard side on the far side of the scan compared with a symmetric velocity (dashed lines) scan.

FIG. 13 shows an example of a scan velocity profile described by the system of the present disclosure. In the schematic shown in FIG. 13, the positive x positions are the far side positions 301 of the wafer center where the scan speed is reduced to increase the etching on the outboard side 192 of the device. Overall excellent uniformity of etching across the full wafer 180 is preserved by increasing the scan velocity on the negative X side of the scan (e.g., when the wafer 180 is closer to the ion source 105), than what a symmetric variable scan profile 303 requires for good uniformity.

A scan velocity can be a function of the wafer distance from the ion beam 105 during a scan. A scan velocity can decrease as the distance between the wafer 180 and the ion beam 130 increases during a scan. A scan velocity can increase as the area of the wafer 180 exposed to the beam 130 increases. A scan velocity can decrease as the area of the wafer 180 exposed to the beam 130 decreases.

In some embodiments, a scan acceleration can vary during a scan. A scan acceleration profile can be asymmetric. A scan acceleration can be identical between at least 2 scans. A scan acceleration curve is a plot of the wafer acceleration vs. the position of the wafer 180 along the scan path. A scan acceleration curve can be identical for more than 2 scans. A scan acceleration curve can be identical for all scans. A scan acceleration curve can be different between at least 2 scans. A scan acceleration curve can be different for more than 2 scans. A scan acceleration curve can be different for all scans. A scan acceleration can be constant during at least a portion of a scan. A scan velocity can be selected to maintain a constant dose of ions across at least one region of the wafer 180 during a scan. A scan velocity can be selected to maintain a constant dose of ions across all exposed regions of the wafer 180 during a scan.

Figure 14:
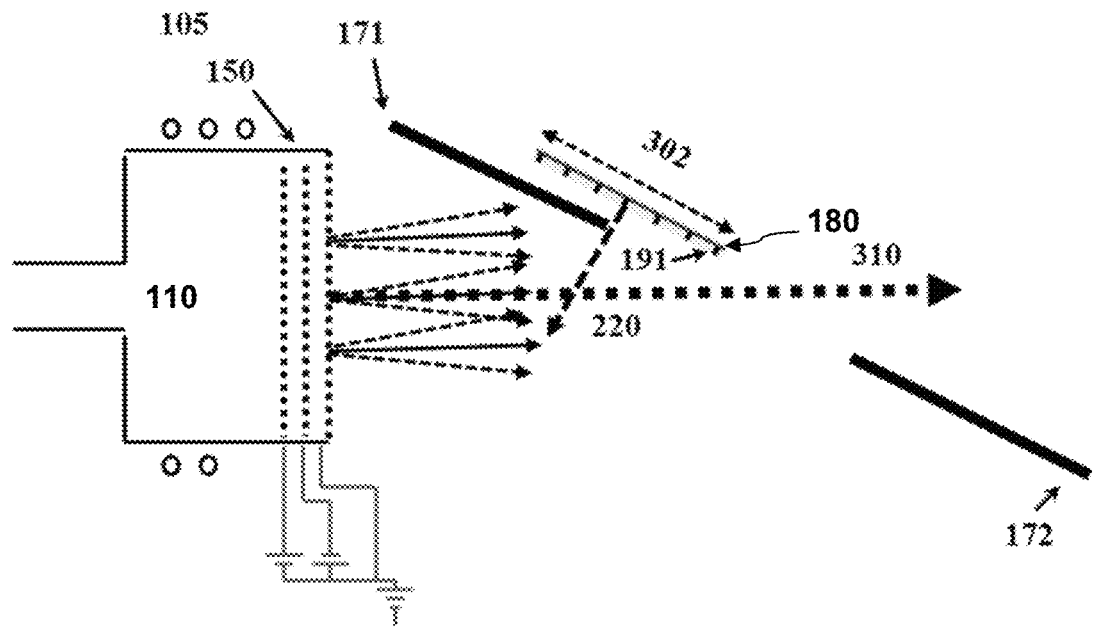
FIG. 14 illustrates the mid-plane of the source, and near side of scan where preferential etching of the inboard side of the devices occurs.

Increasing the scan velocity when the wafer center is on the near side of the scan 302, which are the points above the mid-plane 310 of the ion source 105 and grid system 150, as shown for example in FIG. 14, reduces the etching on the inboard side 191 of the devices. In the schematic shown in FIGS. 8, 13, 14 and 15, the negative X positions are on the near side 302 of the scan. When the wafer center is on the near side 302, increasing the scan speed reduces etching on the inboard side 191 of the device. Overall excellent uniformity of etching across the full wafer 180 is preserved by lowering the scan velocity on the positive X side of the scan. The relationship of such a velocity profile with respect to a symmetric velocity profile 303 required for good film uniformity across the wafer 180 is shown in FIG. 13

Figure 15:
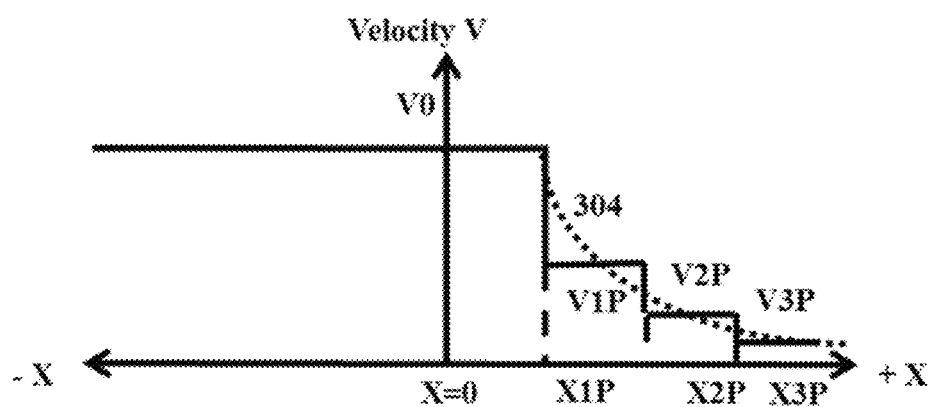
FIG. 15 illustrates one type of an asymmetric velocity profile that is a step type (solid lines) that preferentially etches the outboard side on the far side of the scan compared with an asymmetric velocity profile that is smoothly changing type (dashed lines) scan.

In some embodiments, the shape of the velocity versus position can be a stepped velocity configuration or a smoothly varied configuration, represented by 304 in FIG. 15. An asymmetrical velocity profile causes the wafer 180 to spend more time on the positive x-side (e.g., further away from the ion source 105) than on the negative x-side, assuring more etching on the outboard side 192 of devices compared to the inboard side 191 of the devices. This process of asymmetric velocity of the scan enables inboard and outboard asymmetry control even when the etching system is configured with an ion source 105 having lateral dimensions smaller than the sum of wafer diameter and twice the beamlet divergence projection on the wafer scan plane.

The inboard side 191 of the device can be preferentially etched by slowing down the scan speed on the near side to correct for asymmetry arising in systems with sources that have a beam of less density at the center of the source compared to the density away from the center of the source.

Exemplary ion beam etch process parameters are as follows.

Plasma source power approximately in the range of 100 W-5 kW.

Process chamber pressures in the range of 1E-3 Torr to 1E-5 Torr.

Gas compositions can contain an inert gas (e.g., Ar, Kr, Xe, He, etc., or mixtures of these).

Gas compositions can contain reactive gases (e.g., halogen containing gases, $C_xH_yF_z$, $Cl_2$, oxygen containing gases, $O_2$, nitrogen containing gases, $N_2$, $NF_3$, carbon containing gases, $CH_4$, $CO$, $CO_2$, sulfur containing gases, $SF_6$, hydrogen containing gases, $H_2$, $H_2O$, or mixtures of these).

Gas compositions can contain a mixture of inert and reactive gases.

Wafer temperature can range from approximately −40 C to 400 C.

Wafer scan speeds can range from approximately 0.01 mm/sec to 1 cm/sec. In one embodiment, the wafer scan speeds range from 1 mm/sec to 100 mm/sec.

Wafer rotation speeds range from approximately 0.5 RPM to 1000 RPM.

Ion beam voltages are typically less than about 500 eV.

Wafer tilt angles range from approximately 1 degree (e.g., 1 degree off perpendicular to the ion beam 105) to about 85 degrees (e.g., a glancing angle to the ion beam 105).

Any of the steps and procedures described above, while referred to herein as being included in the etching process, may also be applied to a deposition process.

Figure 16:
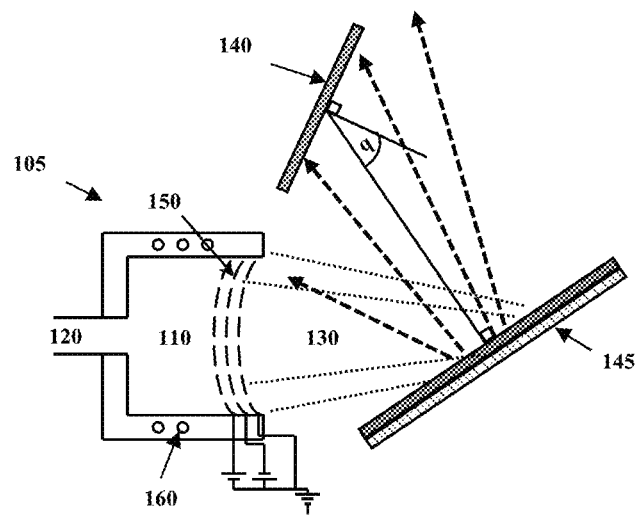
FIG. 16 illustrates an ion beam deposition system.

FIG. 16 illustrates an ion beam deposition (IBD) system. In an IBD process, a target 145 is placed in front of an ion source 105. Ion source 105 can be comprised of a plasma chamber 110, and an ion extraction grid system 150. Ion extraction grid system 150 is comprised of a plurality of conducting plates that have multiple holes therein aligned from plate to plate. Grid system 150 extracts and helps collimate ion beamlets coming out of each of the holes of the plates, and forms a substantially collimated ion beam 130. Plasma in the plasma chamber 110 may be generated by methods known in the art including direct current (DC) and radio frequency (RF) inductively coupled plasma (ICP) coils 160. The energy of the ions extracted from the ion source 105 is defined by the voltages applied to the grid system 150. The extracted ions in the collimated ion beam 130 impinge on the target 145 causing a sputtering of target material in a deposition plume towards a wafer on the wafer stage 140.

The stage 140 can rotate the wafer about a central axis. The stage 140 can tilt the wafer with respect to the sputtered material for at least a portion of the deposition process. The deposition plume of sputtered material from the target 145 can be directed at any angle with respect to the wafer surface by tilting the wafer stage 140. Provisions may be made on the wafer stage 140 to cool the wafer during the deposition process to prevent thermal damage to the devices on the wafer. The wafer may also be heated to a specific temperature to enhance the ion beam deposition process.

In a perfect ion beam deposition system all beamlets and sputtered material in the deposition plume would be perfectly collimated, with no divergence of the ions and/or sputtered material from the intended direction. In such a system, all features deposited on the wafer would be perfectly symmetrical. However, practical ion beam deposition systems have non-zero beam divergence and non-zero deposition plume divergence.

In practice, ion sources generate an ion beam that is a collection of beamlets with a finite non-zero beam divergence. Further, the sputtered material in the deposition plume has a finite non-zero divergence. A consequence of the sputtered material divergence within the deposition plume is that as the wafer is tilted away from normal sputtered material incidence, there will be more intense deposition on the side of the wafer nearer to the target, and less intense deposition on the side of the wafer farther from the target. By rotating the wafer about an axis, the deposition depths can be made more uniform in the areas of the wafer that are feature free. Devices on the wafers however are typically made of features in 3-dimensions and not flat surfaces. On 3-dimensional features on the wafer, the effect of the tilting of the wafer away from normal sputtered material incidence of the deposition plume, in conjunction with beam divergence, is that the inboard side of the devices on the wafer will experience a different amount of sputtered material exposure from the deposition plume than the outboard side of the devices. This inboard and outboard asymmetry becomes more pronounced as the location of the devices is farther away from the tilt axis of the wafer, and as the tilt angle is increased away from normal sputtered material incidence of the deposition plume.

Figure 17:
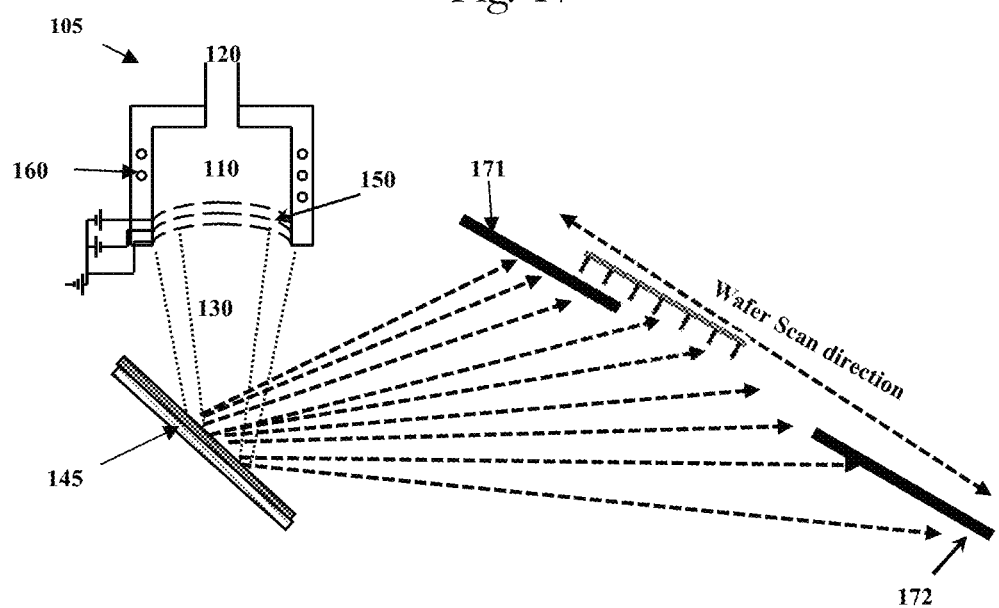
FIG. 17 illustrates an improved scanning ion beam deposition system according to an embodiment of the present disclosure.

Translating (e.g., scanning) the wafer across the deposition plume of sputtered material can address asymmetry between the inboard side of the device and the outboard side of the device. In FIG. 17, where deposition plume exposure occurs is defined through the introduction of physical beam blocks 171, and 172. The required scan length can be decreased by inserting physical blocks, 171 and 172, towards the ends of the scan, as shown in FIG. 17. The blocks 171 and 172 form an aperture that narrows the deposition plume of sputtered material, thus creating a portion or "slit" of the deposition plume through which the wafer is scanned. The blocks 171 and 172 may be inserted symmetrically with respect to the mid-plane of the deposition plume as shown in FIG. 17. The blocks 171 and 172 can be inserted asymmetrically with respect to the mid-plane of the deposition plume. The slit width can be made adjustable by adjusting the positions of the upper block 171, or the lower block 172, or both. However, in cases where scanning the wafer across the slit of the deposition plume at large tilt angles is required, the distance from the target to the wafer at its scan midpoint can be much larger than in conventional ion beam deposition (IBD) systems.

In practical IBD systems, the beam density of the deposition plume of sputtered material can be spatially non-uniform. This non-uniformity can be due to deposition plume divergence. This effect often increases as the target-to-wafer distance increases and can be amplified by a large distance between the wafer scan's mid-point. Scanning the wafer through the deposition plume at constant scan velocity can result in a deposition that is highly non-uniform, with the wafer center depositing much faster than the edge of the wafer. Deploying a variable scan velocity, can dramatically improve the deposition uniformity over the entire wafer. Slowing down the velocity of the scan when the wafer is away from the midpoint of the scan can enhance the deposition process at the points of the wafer away from its center.

In some embodiments, the wafer velocity can be changed during the wafer scan. The wafer scan velocity can be continuously changing during a scan. The wafer scan velocity can be constant during some portion of a scan. The wafer velocity profile can be identical for at least 2 scans. The wafer scan velocity profile can be identical for all scans. The wafer scan velocity can change between at least two scans. The wafer scan velocity profile can change for each scan. The wafer scan velocity can be zero during at least one point during the scan. The wafer velocity profile can be symmetric. The scan velocity profile can be monotonic. The scan velocity profile can be discontinuous.

Figure 18:
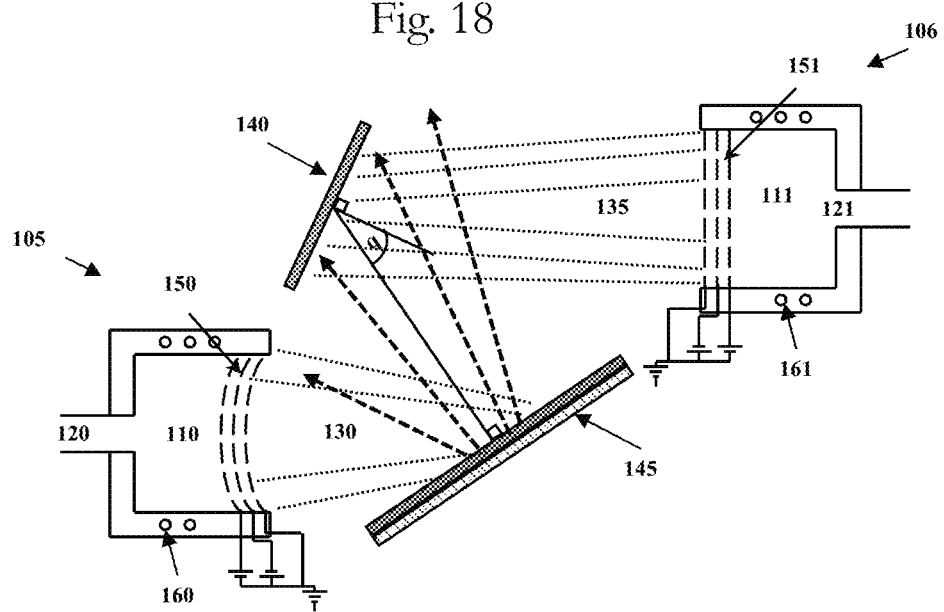
FIG. 18 illustrates an ion beam deposition system with a pre-clean assist source.

FIG. 18 illustrates an ion beam deposition system with a pre-clean assist source. In this embodiment of the present invention, an additional ion source 106 is provided in the Ion Beam Deposition system. At least one surface of the wafer on the wafer stage 140 can be exposed to a beam 135 from ion source 106. Ion source 106 can be comprised of a plasma chamber 111, and an ion extraction grid system 151. Ion extraction grid system 151 is comprised of a plurality of conducting plates that have multiple holes therein aligned from plate to plate. Grid system 151 extracts and helps collimate ion beamlets coming out of each of the holes of the plates, and forms an ion beam 135. Plasma in the plasma chamber 111 may be generated by methods known in the art including direct current (DC) and radio frequency (RF) inductively coupled plasma (ICP) coils 161. The energy of the ions extracted from the ion source 106 is defined by the voltages applied to the grid system 151. The ion beam 135 from ion source 106 can be used to improve film properties of the deposited material, such as stoichiometry of compounds, intrinsic stress, optical properties, etc. The ion beam 135 from ion source 106 can also be utilized for pre-clean of wafers prior to the deposition process to enhance film adhesion to the wafer. However, integration of the ion source 106 within the IBD does not change the inherent Inboard/Outboard asymmetry of sidewall deposition thickness on 3-D features.

Although a variety of examples and other information was used to explain aspects within the scope of the appended claims, no limitation of the claims should be implied based on particular features or arrangements in such examples, as one of ordinary skill would be able to use these examples to derive a wide variety of implementations. Further, and although some subject matter may have been described in language specific to examples of structural features and/or method steps, it is to be understood that the subject matter defined in the appended claims is not necessarily limited to these described features or acts. For example, such functionality can be distributed differently or performed in components other than those identified herein. Rather, the described features and steps are disclosed as examples of components of systems and methods within the scope of the appended claims. Moreover, claim language reciting "at least one of" a set indicates that one member of the set or multiple members of the set satisfy the claim.

What is claimed is:

1. In an ion-beam sputtering system having a vacuum chamber, a wafer on a stage, a target material, an ion-beam source, a method of depositing a uniform layer of sputtered material onto said wafer in said ion-beam sputtering system, comprising the steps of:
   generating ions from the ion beam source;
   directing the generated ions at the target material whereby a portion of the target material is sputtered toward said wafer as part of a deposition plume;
   exposing the wafer to the deposition plume within a deposition zone; and
   scanning the wafer across the deposition zone along a scan path relative to the deposition plume, wherein a scan velocity of the wafer is varied as the wafer travels along the scan path, wherein the scan velocity decreases as an area of the wafer exposed to the deposition plume decreases.

2. The method of claim 1, further comprising rotating the stage during at least a portion of the scanning step.

3. The method of claim 1, further comprising tilting the stage with respect to the deposition plume during at least a portion of the scanning step.

4. The method of claim 1, wherein the scan path is linear.

5. The method of claim 1, wherein the scan path is non-linear.

6. The method of claim 1, further comprising inserting a plurality of physical blocks along the scan path.

7. The method of claim 1, further comprising adjusting an amount of time the wafer is exposed to the deposition plume.

8. The method of claim 1, wherein the scan velocity of the wafer is slowed as a center of the wafer travels along a far side of the scan path.

9. The method of claim 1, wherein the scan velocity decreases as a distance between the wafer and the target material increases during the scanning step.

10. In an ion-beam sputtering system having a vacuum chamber, a wafer on a stage, a target material, an ion-beam source, a method of depositing a uniform layer of material on said wafer in said ion-beam sputtering system, comprising the steps of:
    generating ions from the ion beam source;
    directing the generated ions at the target material whereby a portion of the target material is sputtered toward said wafer as part of a deposition plume;
    exposing the wafer to the deposition plume within a deposition zone; and
    scanning the wafer across the deposition zone along a scan path relative to the deposition plume in accordance with a scan velocity function, wherein a scan velocity of the wafer is varied as the wafer travels along the scan path, wherein the scan velocity decreases as an area of the wafer exposed to the deposition plume decreases.

11. The method of claim 10, further comprising rotating the stage during at least a portion of the scanning step.

12. The method of claim 10, further comprising tilting the stage with respect to the deposition plume during at least a portion of the scanning step.

13. The method of claim 10, wherein the scan path is linear.

14. The method of claim 10, wherein the scan path is non-linear.

15. The method of claim 10, further comprising inserting a plurality of physical blocks along the scan path.

16. The method of claim 10, further comprising adjusting an amount of time the wafer is exposed to the deposition plume.

17. The method of claim 10, wherein the scan path further comprising a scan out path from a first end of the deposition plume to a second end of the deposition plume and a scan back path from the second end of deposition plume to the first end of the deposition plume, wherein the scan out path is the same as the scan back path.

18. The method of claim 10, wherein the scan path further comprising a scan out path from a first end of the deposition plume to a second end of the deposition plume and a scan back path from the second end of deposition plume to the first end of the deposition plume, wherein the scan out path is different from the scan back path.

19. The method of claim 10, wherein the scan path further comprising a scan out path from a first end of the deposition plume to a second end of the deposition plume and a scan back path from the second end of deposition plume to the first end of the deposition plume, wherein an endpoint of the scan out path is different from an endpoint of the scan back path.

20. The method of claim 10, wherein the scan path further comprising a scan out path from a first end of the deposition plume to a second end of the deposition plume according to a scan out velocity function and a scan back path from the second end of deposition plume to the first end of the deposition plume according to a scan back velocity function, wherein the scan out velocity function is different from the scan back velocity function.

21. The method of claim 10, wherein the scan path further comprising a scan out path from a first end of the deposition plume to a second end of the deposition plume according to a scan out velocity function and a scan back path from the second end of deposition plume to the first end of the deposition plume according to a scan back velocity function, wherein the scan out velocity function or the scan back velocity function varies as a function of time.

* * * * *